(12) United States Patent
Lin et al.

(10) Patent No.: US 11,134,578 B2
(45) Date of Patent: Sep. 28, 2021

(54) LOCKING DEVICE AND CHASSIS USING LOCKING DEVICE

(71) Applicant: HONGFUJIN PRECISION ELECTRONICS(TIANJIN)CO., LTD., Tianjin (CN)

(72) Inventors: Chieh-Hsiang Lin, New Taipei (TW); Wen-Chen Wang, New Taipei (TW); Jia-Feng Lin, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/845,365

(22) Filed: Apr. 10, 2020

(65) Prior Publication Data
US 2021/0274667 A1  Sep. 2, 2021

(30) Foreign Application Priority Data

Feb. 28, 2020 (CN) .......................... 202010131550.2

(51) Int. Cl.
*H05K 5/02* (2006.01)
*H05K 7/14* (2006.01)
*G11B 33/12* (2006.01)

(52) U.S. Cl.
CPC ......... *H05K 5/0221* (2013.01); *G11B 33/124* (2013.01); *H05K 5/023* (2013.01); *H05K 7/1401* (2013.01)

(58) Field of Classification Search
CPC ...................................................... H05K 7/14
See application file for complete search history.

(56) References Cited

U.S. PATENT DOCUMENTS 6,939,319 B1 *  9/2005  Anstead .................. A61M 5/30
                                                      604/68
2004/0008497 A1 *  1/2004  Barringer ............. H05K 7/1461
                                                      361/759

FOREIGN PATENT DOCUMENTS

TW          I528886 B    4/2016

* cited by examiner

*Primary Examiner* — Jerry Wu
(74) *Attorney, Agent, or Firm* — ScienBiziP, P.C.

(57) ABSTRACT

A locking device includes a housing, a first linking member, a second linking member, a push-pull member, and a stopper. The push-pull member defines a first sliding groove. A first end portion of the first linking member is slidably received in the first sliding groove, and a second end portion of the first linking member is rotationally fixed on the housing. The housing defines a second sliding groove. The stopper is slidably received in the second sliding groove. A second end portion of the second linking member is rotationally mounted on the first linking member. The first end portion of the first linking member is driven by the push-pull member to move along the first sliding groove, which drives the second linking member to rotate, which drives the stopper to move along the second sliding groove.

15 Claims, 8 Drawing Sheets

LOCKING DEVICE AND CHASSIS USING LOCKING DEVICE

FIELD

The subject matter herein generally relates to locking devices, and more particularly to a locking device for locking a chassis.

BACKGROUND

Generally, a storage device is connected to a hard disk in a chassis. However, when the storage device is inserted into the chassis, a connection between the storage device and the hard disk may not be stable.

BRIEF DESCRIPTION OF THE DRAWINGS

Implementations of the present disclosure will now be described, by way of embodiments, with reference to the attached figures.

DETAILED DESCRIPTION

Figure 1:
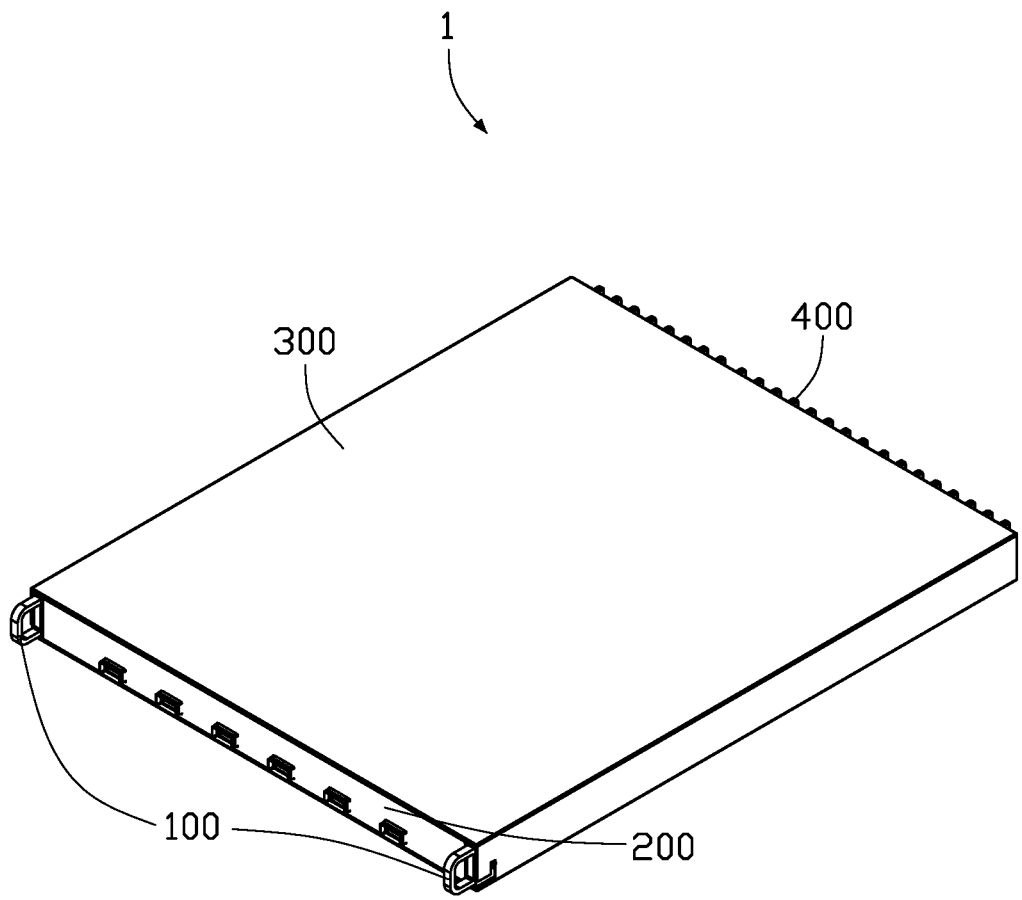
FIG. 1 is an assembled, isometric view of an embodiment of a chassis according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
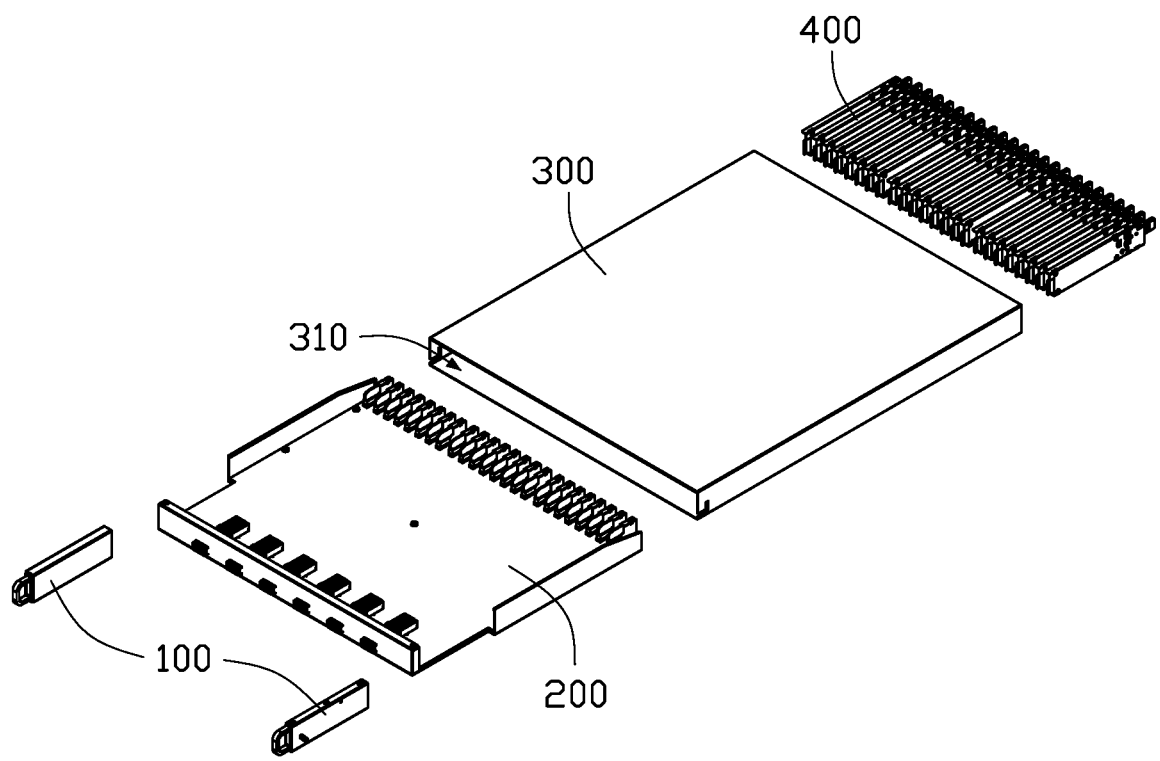
FIG. 2 is an exploded, isometric view of the chassis in FIG. 1.

FIG. 1 and FIG. 2 show an embodiment of two locking devices 100, a storage device 200, a case 300, and a hard disk 400. The case 300 defines an opening 310 for receiving the storage device 200 and the two locking devices 100. The hard disk 400 is located in the case 300 at an end of the case 300 away from the opening 310. The two locking devices 100 are respectively fixed on two sides of the storage device 200 for detachably fixing the storage device 200 to the case 300 for inserting the hard disk 400.

Referring to FIGS. 3-6, the fixing device 100 includes a housing 10, a first linking member 20, a second linking member 30, a push-pull member 40, a stopper 50, and a resilient member 60. The housing 10 includes an inner housing 11 and an outer housing 12. The inner housing 11 and the outer housing 12 may be connected together by screws. The first linking member 20, the second linking member 30, the push-pull member 40, and the resilient member 60 are received inside the housing 10. The inner housings 11 of the two housings 10 are respectively fixedly connected to opposite sides of the storage device 200.

Figure 3:
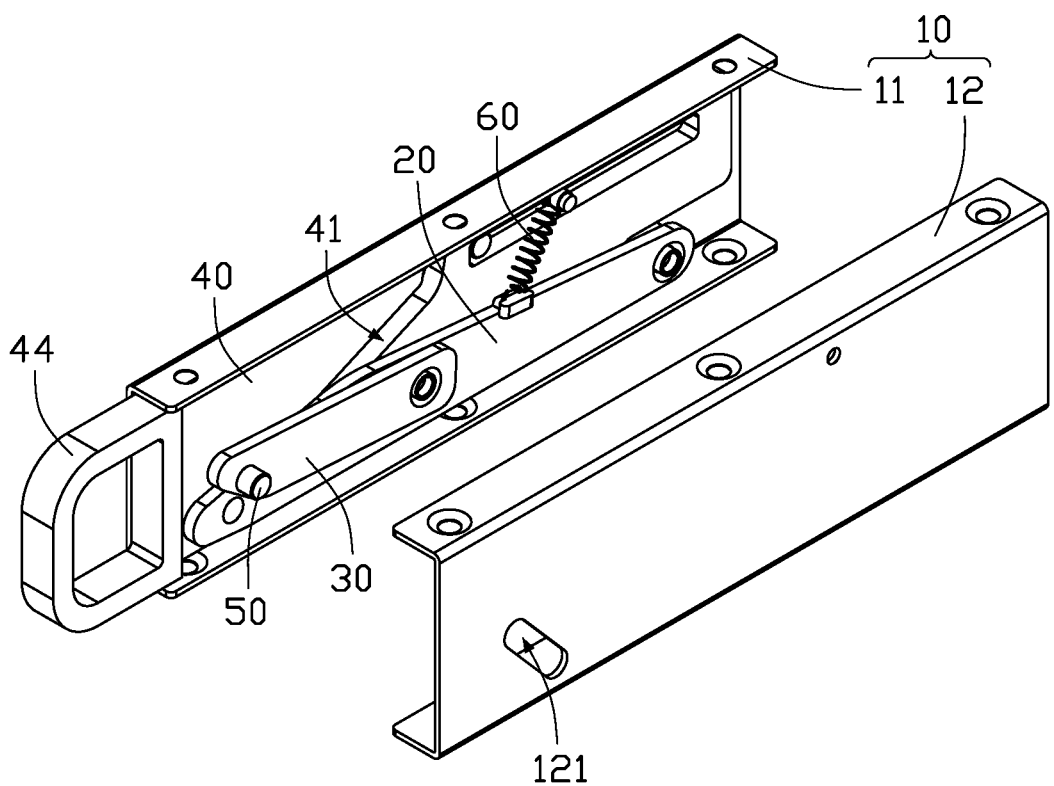
FIG. 3 is a partial exploded, isometric view of a locking device of the chassis according to the present disclosure.

Referring to FIG. 3, an end of the push-pull member 40 includes a handle 44. The push-pull member 40 is slidably mounted on the inner housing 11, such that the handle 44 is located outside of the housing 10. The push-pull member 40 defines a first sliding groove 41. The first sliding groove 41 is an inclined groove, such that the first sliding groove 41 is inclined upward in a pushing direction of the push-pull member 40 and inclined downward in a pulling direction of the push-pull member 40. A first end portion of the first linking member 20 is slidably received in the first sliding groove 41, and a second end portion of the first linking member 20 is rotationally mounted on the inner housing 11 adjacent to an end of the inner housing 11 opposite the handle 44. When the push-pull member 40 is pulled out of the housing 10, the push-pull member 40 drives the first end portion of the first linking member 20 to slide from a bottom of the first sliding groove 41 to a top of the first sliding groove 41, thereby driving the first linking member 20 to rotate clockwise by a certain angle. When the push-pull member 40 is pushed into the housing 10, the push-pull member 40 drives the first end portion of the first linking member 20 to slide from the top of the first sliding groove 41 to the bottom of the first sliding groove 41, thereby driving the first linking member 20 to rotate counterclockwise by the certain angle.

Still referring to FIG. 3, a second sliding groove 121 is defined in the outer housing 12 adjacent to an end of the outer housing 12 adjacent to the handle 44. The second sliding groove 121 is an inclined groove, such that the second sliding groove 121 is inclined downward in the pushing direction of the push-pull member 40 and inclined upward in the pulling direction of the push-pull member 40. The stopper 50 is substantially cylindrical and is fixedly mounted on a first end portion of the second linking member 30. The stopper 50 is slidably received in the second sliding groove 121 and protrudes through the second sliding groove 121. The stopper 50 slidably mounts the first end portion of the second linking member 30 in the second sliding groove 121, and a second end portion of the second linking member 30 is rotationally mounted between two ends of the first linking member 20. When the push-pull member 40 is pulled out of the housing 10, the clockwise rotation of the first linking member 20 drives the second linking member 30 to rotate counterclockwise, so that the stopper 50 slides from a top of the second sliding groove 121 to a bottom of the second sliding groove 121. When the push-pull member 40 is pushed into the housing 10, the counterclockwise rotation of the first linking member 20 drives the second linking member 30 to rotate clockwise, so that the stopper 50 slides from the bottom of the second sliding groove 121 to the top of the second sliding groove 121.

Figure 4:
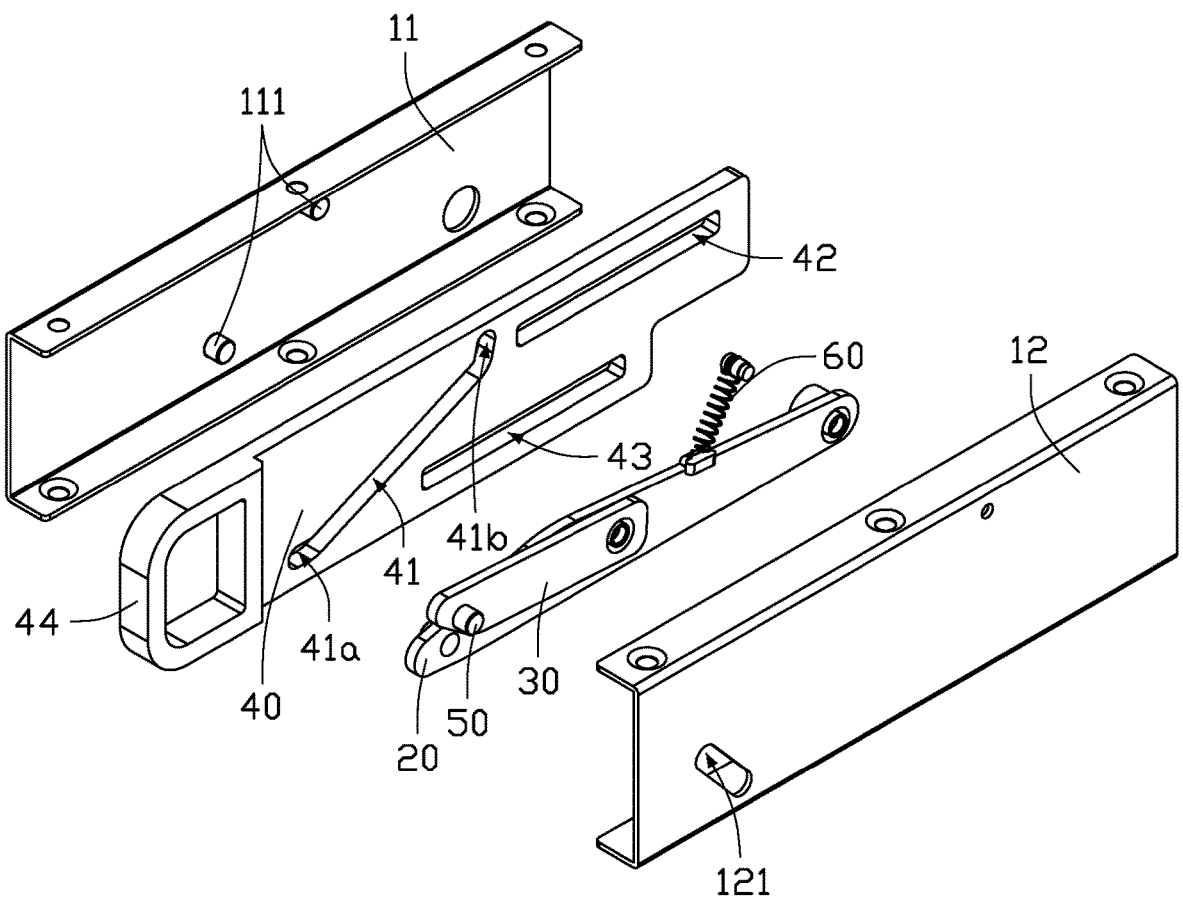
FIG. 4 is an exploded, isometric view of the locking device in FIG. 3.
Figure 5:
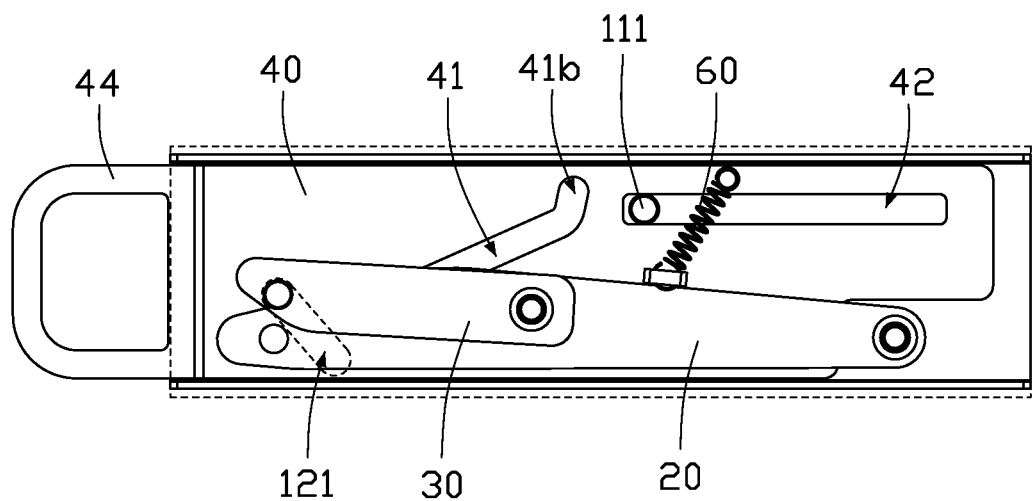
FIG. 5 is a cross-sectional view of the locking device in a pushed-in state.
Figure 6:
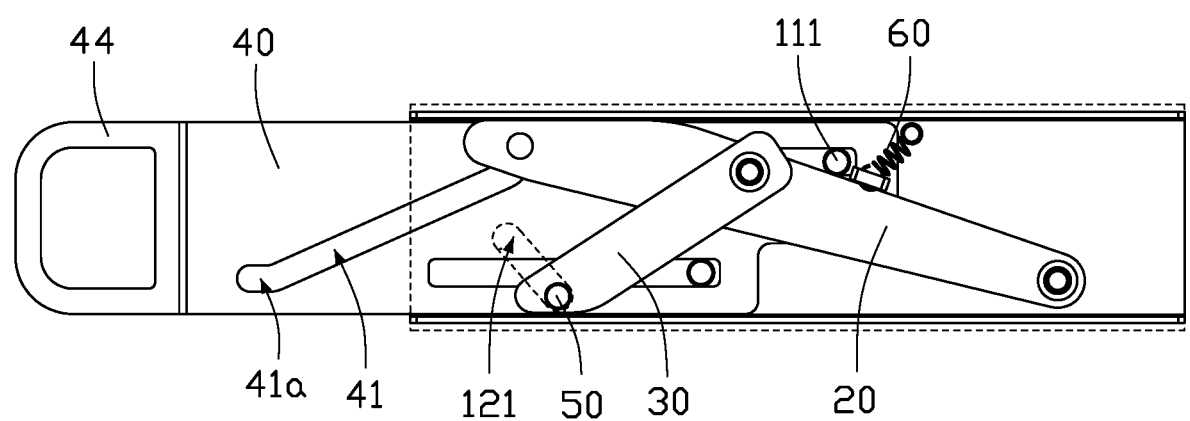
FIG. 6 is a cross-sectional view of the locking device in a pulled-out state.

Referring to FIG. 4, the push-pull member 40 defines a first locking groove 41a communicating with a lower end of the first sliding groove 41. The first locking groove 41a extends in a direction parallel to a moving direction of the push-pull member 40. When the push-pull member 40 is pushed into the housing 10, the first end portion of the first linking member 20 slides from the top of the first sliding groove 41 to the bottom of the first sliding groove 41. The first locking groove 41a prevents the first linking member 20 from rotating when the first end portion of the first linking member 20 is received in the first locking groove 41a, thereby having a locking effect.

Still referring to FIG. 4, the push-pull member 40 defines a second locking groove 41b communicating with an upper end of the first sliding groove 41. The second locking groove 41b extends in a direction perpendicular to a moving direction of the push-pull member 40. When the push-pull member 40 is pulled out of the housing 10, the first end portion of the first linking member 20 slides from the bottom of the first sliding groove 41 to the top of the first sliding groove 41. The second locking groove 41b prevents the first linking member 20 from rotating when the first end portion of the first linking member 20 is received in the second locking groove 41b, thereby having a locking effect.

Referring to FIG. 3, a first end of the resilient member 60 is fixed on the inner housing 11 on a side of the first linking member 20 adjacent to the top of the first sliding groove 41. A second end of the resilient member 60 is fixed between two ends of the first linking member 20. The resilient member 60 is configured to apply a pulling force on the first linking member 20 in a direction away from the second linking member 30, which strengthens a locking effect when the first end portion of the first linking member 20 is locked in the first locking groove 41a or locked in the second locking groove 41b. Furthermore, when the push-pull member 40 is pulled out of the housing 10, a restoring force of the resilient member 60 assists in pulling out the push-pull member 40.

Referring to FIG. 4, the push-pull member 40 further defines a third sliding groove 42 and a fourth sliding groove 43. The third sliding groove 42 and the fourth sliding groove 43 extend in a direction parallel to a moving direction of the push-pull member 40. The third sliding groove 42 is located at a top portion of the push-pull member 40, and the fourth sliding groove 43 is located at a bottom of the push-pull member 40. Two sliding posts 111 are fixed on a side of the inner housing 11 facing the push-pull member 40. The two sliding posts 111 are respectively slidably received in the third sliding groove 42 and the fourth sliding groove 43 to limit a position of the push-pull member 40 and prevent the push-pull member 40 from moving perpendicular to a sliding direction of the push-pull member 40.

An incline direction of the first sliding groove 41 is opposite to an incline direction of the second sliding groove 121. A length of the first linking member 20 is longer than a length of the second linking member 30. A length of the first sliding groove 41 is longer than a length of the second sliding groove 121. When pushing/pulling the push-pull member 40, a connection structure of the first linking member 20 and the second linking member 30 cooperates with the resilient member 60 to achieve a labor-saving effect.

Figure 7:
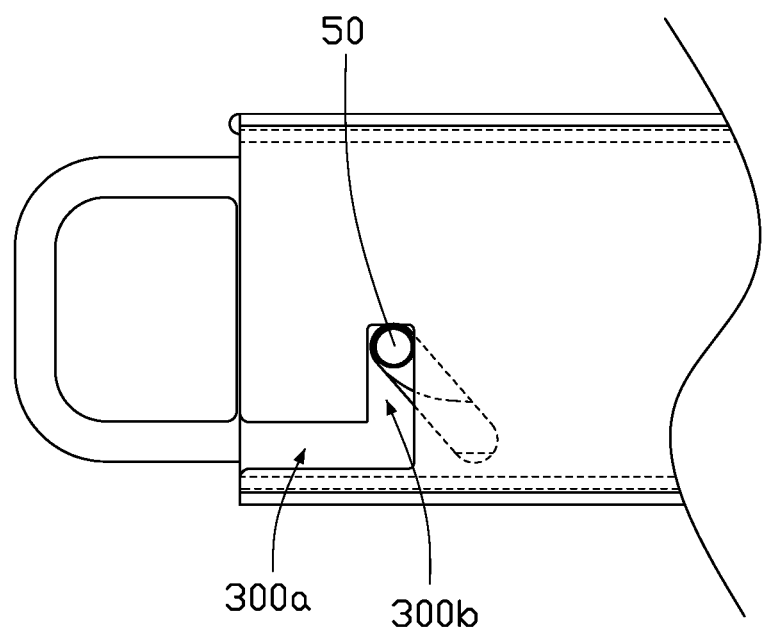
FIG. 7 is a cross-sectional view of a case of the chassis and the locking device in the pushed-in state according to the present disclosure.
Figure 8:
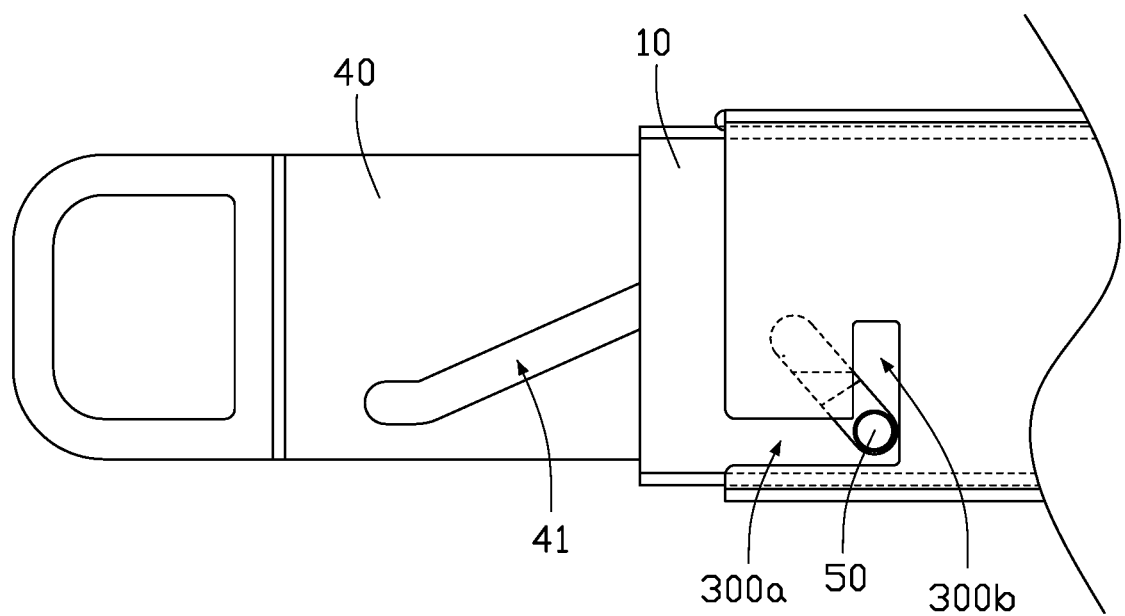
FIG. 8 is a cross-sectional view of the case and the locking device in the pulled-out state.

Referring to FIG. 7 and FIG. 8, two opposite side walls of the case 300 adjacent to the opening 310 define a parallel groove 300a and a perpendicular groove 300b. The parallel groove 300a is substantially perpendicular to the perpendicular groove 300b. The parallel groove 300a extends in a direction parallel to the moving direction of the push-pull member 40. A first end of the parallel groove 300a extends to the opening 310. A second end of the parallel groove 300a communicates with the perpendicular groove 300b. A bottom of the parallel groove 300a is a same height from a bottom of the case 300 as a bottom of the second sliding groove 121. A top of the perpendicular groove 300b is a same height from the bottom of the case 300 as a top of the second sliding groove 121.

When the push-pull member 40 is pushed in, the stopper 50 moves from the bottom of the second sliding groove 121 to the top of the second sliding groove 121, and simultaneously slides from the parallel groove 300a and a bottom of the perpendicular groove 300b to the top of the perpendicular groove 300b. The stopper 50 in the perpendicular groove 300b prevents the storage device 200 from sliding out of the case 300. When the first linking member 20 is locked in the first sliding groove 41a, the storage device 200 is inserted into the case 300.

When the push-pull member 40 is pulled out, the stopper 50 moves from the top of the second sliding groove 121 to the bottom of the second sliding groove 121, and simultaneously slides from the top of the perpendicular groove 300b to the bottom of the perpendicular groove 300b and the parallel groove 300a. Then, the push-pull member 40 is pulled to move the stopper 50 out of the parallel groove 300a and detach the storage device 200 from the hard disk 400.

In operation of the locking device 100, the push-pull member 40 is first positioned in the pulled-out position so that the stopper 50 is displaced at the bottom of the second sliding groove 121. Then, the storage device 200 is inserted into the opening 310, and at the same time, the stopper 50 is inserted into the bottom of the perpendicular groove 300b at the joint between the parallel groove 300a and the perpendicular groove 300b. Then, the push-pull member 40 is pushed into the housing 10, which causes the stopper 50 to move from the bottom of the second sliding groove 121 to the top of the second sliding groove 121, and at the same time, causes the stopper 50 to move from the bottom of the perpendicular groove 300b to the top of the perpendicular groove 300b, thereby locking the storage device 200. Thus, the storage device 200 is inserted into the hard disk 400. To remove the storage device 200, the push-pull member 40 is pulled out to cause the stopper 50 to move from the top of the perpendicular groove 300b to the bottom of the perpendicular groove 300b, and then the push-pull piece 40 is pulled out to pull the storage device 200 out of the case 300.

It can be understood that, in other embodiments, the first linking member 20 and the second linking member 30 may adopt a different connection structure in the housing 10, the fixing device 100 may be fixed at other positions of the storage device 200, and the fixing device 100 may be used for fixing other components.

The fixing device 100 operates by the push-pull member 40 driving the first linking member 20 to rotate, thereby driving the second linking member 30 to move, thereby driving the stopper 50 to move in the second sliding groove 121, and thereby driving the stopper 50 to move in the parallel groove 300a and the perpendicular groove 300b. Thus, movement of the storage device 200 is limited to be stably connected to the hard disk 400.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A locking device comprising: a housing; a first linking member; a second linking member; a push-pull member slidably mounted in the housing; and a stopper fixed on a first end portion of the second linking member; wherein: the push-pull member defines a first sliding groove; a first end portion of the first linking member is slidably received in the first sliding groove, and a second end portion of the first linking member is rotationally fixed on the housing; the housing defines a second sliding groove; the stopper is slidably received in and protrudes through the second sliding groove; a second end portion of the second linking member is rotationally mounted on the first linking member; the first end portion of the first linking member is configured to be driven by the push-pull member to move along the first sliding groove; the first end portion of the first linking member moving along the first sliding groove drives the second linking member to rotate; when the push-pull member is pulled out of the housing, the second linking member rotating drives the stopper to move along the second sliding groove toward a direction away from the first linking member.

2. The locking device of claim 1, wherein:
the push-pull member defines a first locking groove communicating with the first sliding groove;
the first locking groove extends in a direction parallel to a moving direction of the push-pull member; and
when the push-pull member is pushed into the housing, the first locking groove locks a position of the first linking member.

3. The locking device of claim 2, wherein:
the push-pull member defines a second locking groove communicating with the first sliding groove;
the second locking groove extends in a direction perpendicular to a moving direction of the push-pull member; and
when the push-pull member is pulled out of the housing, the second locking groove locks a position of the first linking member.

4. The locking device of claim 3, further comprising a resilient member, wherein:
a first end of the resilient member is fixed on the housing, and a second end of the resilient member is fixed on the first linking member; and
the resilient member is configured to apply a pulling force on the first linking member in a direction away from the second linking member when the first linking member is locked in the first locking groove and the second locking groove.

5. The locking device of claim 1, wherein:
the push-pull member defines a third sliding groove and a fourth sliding groove;
the third sliding groove and the fourth sliding groove extend in a direction parallel to a moving direction of the push-pull member; and
the housing comprises two sliding posts respectively slidably received in the third sliding groove and the fourth sliding groove.

6. The locking device of claim 1, wherein:
an end of the push-pull member comprises a handle.

7. The locking device of claim 1, wherein:
an incline direction of the first sliding groove is opposite to an incline direction of the second sliding groove;
a length of the first linking member is longer than a length of the second linking member; and
a length of the first sliding groove is longer than a length of the second sliding groove.

8. A chassis comprising: a case; a storage device; a hard disk; and a locking device fixedly coupled to the storage device, the locking device comprising: a housing; a first linking member; a second linking member; a push-pull member slidably mounted in the housing; and a stopper fixed on a first end portion of the second linking member; wherein: the push-pull member defines a first sliding groove; a first end portion of the first linking member is slidably received in the first sliding groove, and a second end portion of the first linking member is rotationally fixed on the housing; the housing defines a second sliding groove; the stopper is slidably received in and protrudes through the second sliding groove; a second end portion of the second linking member is rotationally mounted on the first linking member; the first end portion of the first linking member is configured to be driven by the push-pull member to move along the first sliding groove; the first end portion of the first linking member moving along the first sliding groove drives the second linking member to rotate; when the push-pull member is pulled out of the housing, the second linking member rotating drives the stopper to move along the second sliding groove toward a direction away from the first linking member.

9. The chassis of claim 8, wherein:
the push-pull member defines a first locking groove communicating with the first sliding groove;
the first locking groove extends in a direction parallel to a moving direction of the push-pull member; and
when the push-pull member is pushed into the housing, the first locking groove locks a position of the first linking member.

10. The chassis of claim 9, wherein:
the push-pull member defines a second locking groove communicating with the first sliding groove;
the second locking groove extends in a direction perpendicular to a moving direction of the push-pull member; and
when the push-pull member is pulled out of the housing, the second locking groove locks a position of the first linking member.

11. The chassis of claim 10, further comprising a resilient member, wherein:
a first end of the resilient member is fixed on the housing, and a second end of the resilient member is fixed on the first linking member; and
the resilient member is configured to apply a pulling force on the first linking member in a direction away from the second linking member when the first linking member is locked in the first locking groove and the second locking groove.

12. The chassis of claim 11, wherein:

the push-pull member defines a third sliding groove and a fourth sliding groove;

the third sliding groove and the fourth sliding groove extend in a direction parallel to a moving direction of the push-pull member; and the housing comprises two sliding posts respectively slidably received in the third sliding groove and the fourth sliding groove.

13. The chassis of claim 12, wherein:

an end of the push-pull member comprises a handle.

14. The chassis of claim 13, wherein:

an incline direction of the first sliding groove is opposite to an incline direction of the second sliding groove;

a length of the first linking member is longer than a length of the second linking member; and a length of the first sliding groove is longer than a length of the second sliding groove.

15. The chassis of claim 14, wherein:

a side wall of the case defines a parallel groove and a perpendicular groove;

the parallel groove is perpendicular to the perpendicular groove;

the parallel groove extends in a direction parallel to a moving direction of the push-pull member;

a first end of the parallel groove extends to an end of the case, and a second end of the parallel groove communicates with the perpendicular groove;

the stopper is configured to be inserted into the parallel groove through the first end of the parallel groove;

when the push-pull member is pushed into the housing, the storage device inserts into the hard disk, and the stopper moves from the parallel groove to the perpendicular groove to lock a position of the storage device; and when the push-pull member is pulled out of the housing, the storage device is removed from the hard disk, and the stopper moves from the perpendicular groove to the parallel groove.

\* \* \* \* \*